United States Patent [19]

Cohen

[11] Patent Number: 5,865,978
[45] Date of Patent: Feb. 2, 1999

[54] NEAR-FIELD PHOTOLITHOGRAPHIC MASKS AND PHOTOLITHOGRAPHY; NANOSCALE PATTERNING TECHNIQUES; APPARATUS AND METHOD THEREFOR

[76] Inventor: Adam E. Cohen, 500 E. 63rd St., #18C, New York, N.Y. 10021-7952

[21] Appl. No.: 854,276

[22] Filed: May 9, 1997

[51] Int. Cl.[6] .............................. C25D 5/02; C25D 5/04; C25F 3/02
[52] U.S. Cl. .......................... 205/118; 205/135; 205/136; 205/137; 205/221; 205/664
[58] Field of Search .................. 205/664, 666, 205/136, 137, 118, 221, 135

[56] References Cited

U.S. PATENT DOCUMENTS

| 2,721,838 | 10/1955 | Visser ................................ 205/664 X |
| 4,968,390 | 11/1990 | Bard et al. ......................... 205/118 X |
| 5,085,746 | 2/1992 | Musselman et al. ............... 205/664 X |
| 5,286,355 | 2/1994 | Fainchtein et al. ................ 205/664 X |
| 5,288,998 | 2/1994 | Betzig et al. ...................... 250/227.26 |
| 5,366,613 | 11/1994 | Suda et al. ......................... 205/666 X |
| 5,504,338 | 4/1996 | Marrian et al. .................... 250/492 |
| 5,630,932 | 5/1997 | Lindsay et al. .................... 205/664 X |
| 5,686,207 | 11/1997 | Suda et al. ........................ 430/5 |

OTHER PUBLICATIONS

Fischer et al. "Submicroscopic pattern replication with visible light" *J. Vac. Sci. Technol.*, 19(4), Nov./Dec. 1981, pp. 881–885.

Primary Examiner—Donald R. Valentine
Attorney, Agent, or Firm—Orrick, Herrington & Sutcliffe, LLP

[57] ABSTRACT

A new field of technology, near-field photolithography, is proposed. In near-field photolithography, an opaque pattern having a nanoscale resolution is made using a modified scanning tunneling microscope to deposit the opaque material on an electrically conductive material. A transparent sheet of indium tin oxide is patterned with a plurality of opaque copper deposits having a nanoscale resolution. The patterned indium tin oxide is then used as a photolithographic mask in the optical near-field. Near-field resolution is not diffraction limited, and near-field photolithography is able to pattern objects with sub-wavelength resolution. As a result, smaller semiconductor microchips can be manufactured and a new nanotechnology, e.g., nanomachines, can be developed. The scanning tunneling microscope (STM) is used as an "electrochemical paintbrush" to transfer the copper from a massive copper supply to the STM electrode tip and then to the ITO surface without degrading the STM tip.

8 Claims, 11 Drawing Sheets

SCHEMATIC OF STM

SCHEMATIC OF STM

TUNNELING CURRENT FEEDBACK CIRCUIT

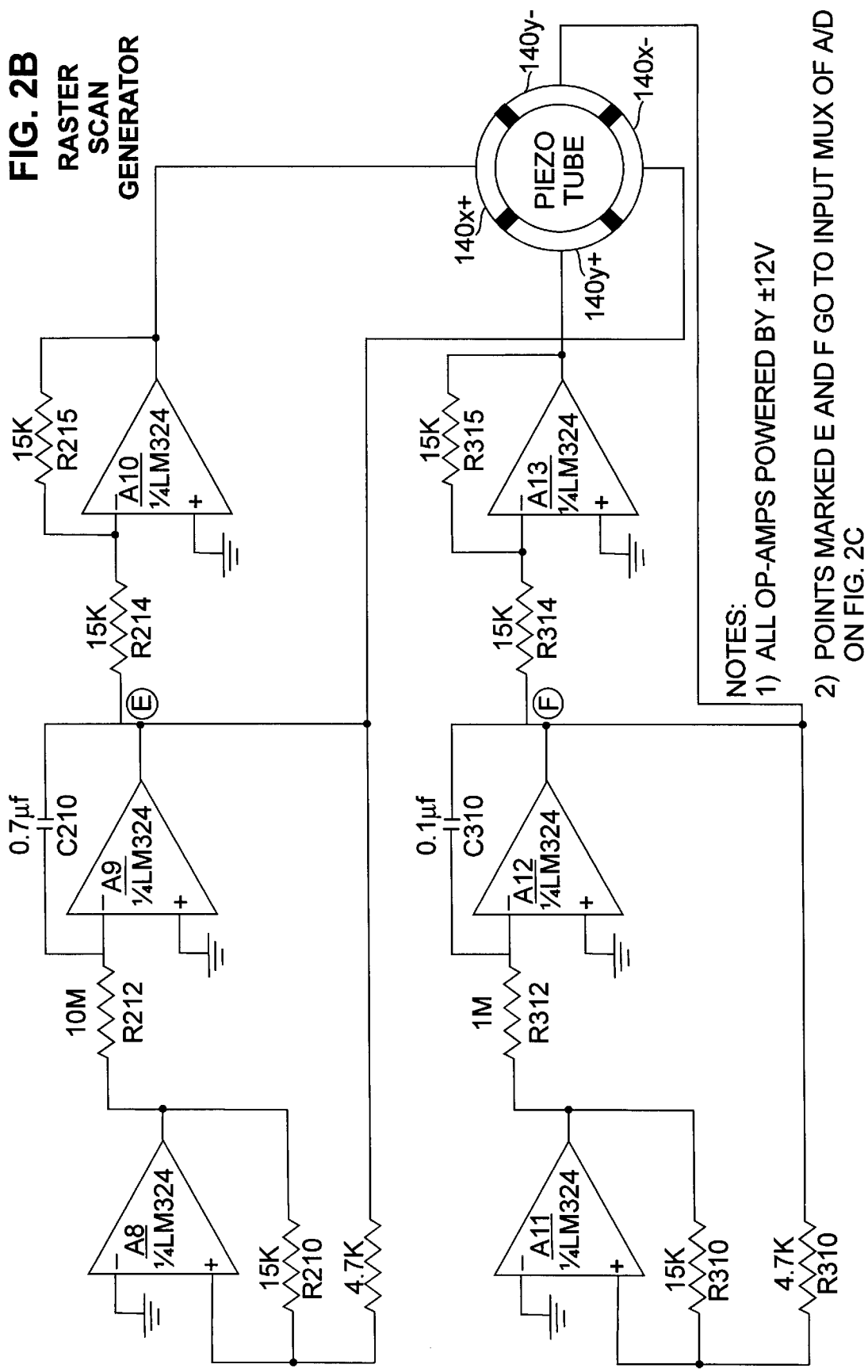
FIG. 2B RASTER SCAN GENERATOR
NOTES:
1) ALL OP-AMPS POWERED BY ±12V
2) POINTS MARKED E AND F GO TO INPUT MUX OF A/D ON FIG. 2C

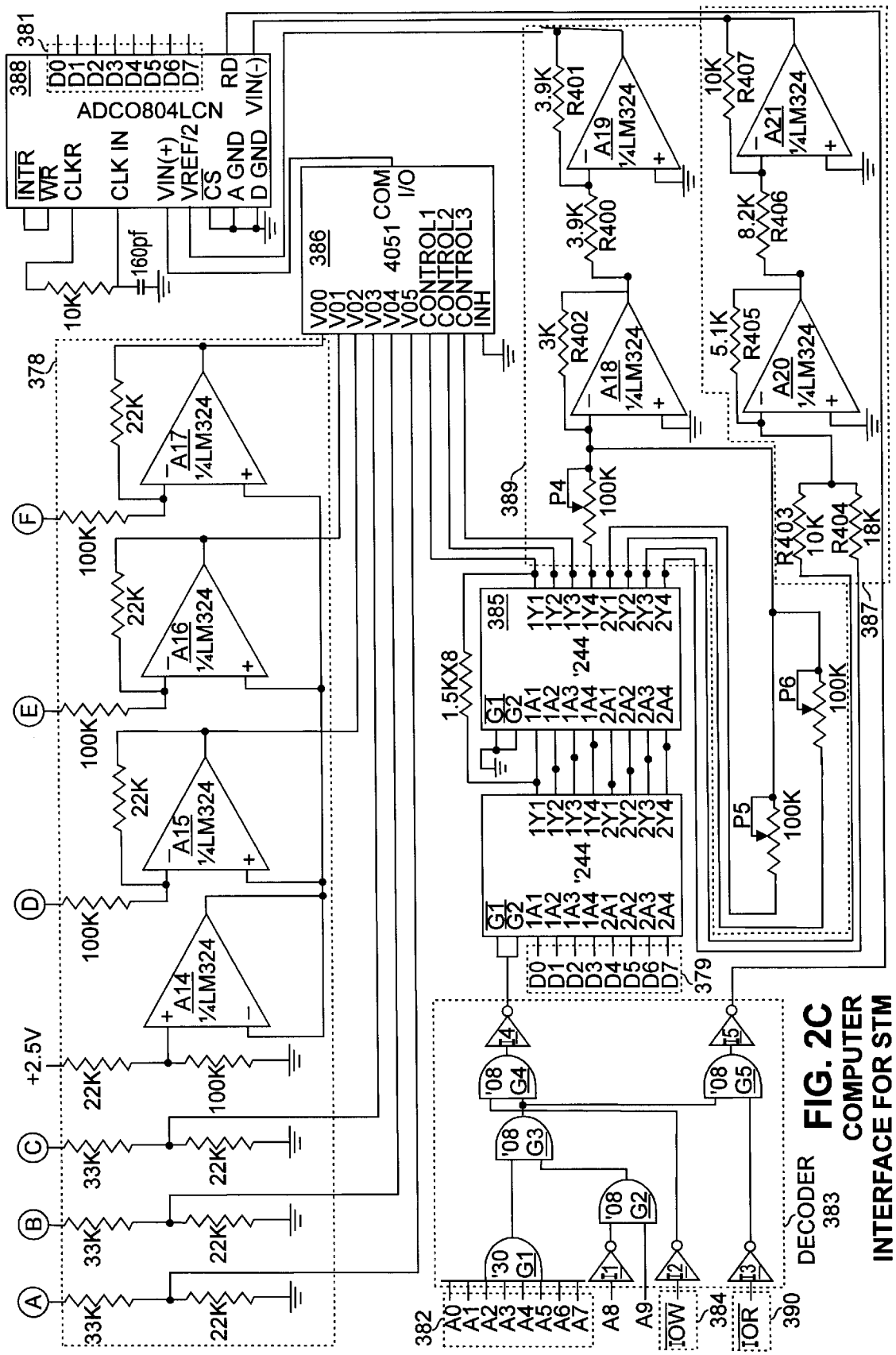
FIG. 2C COMPUTER INTERFACE FOR STM

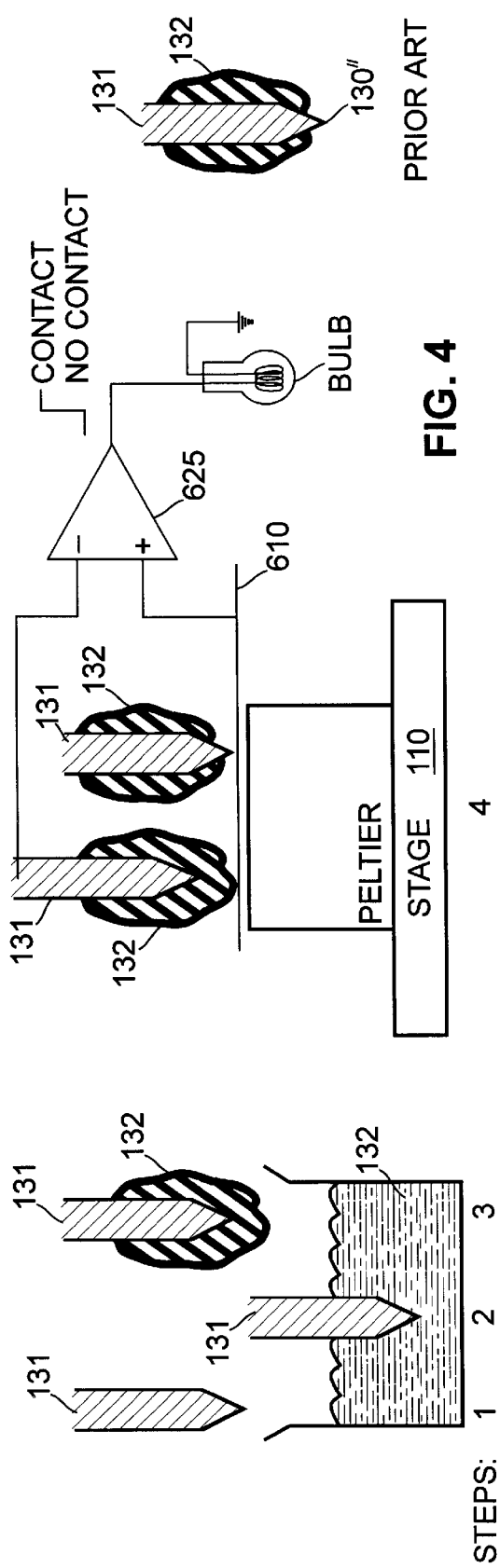
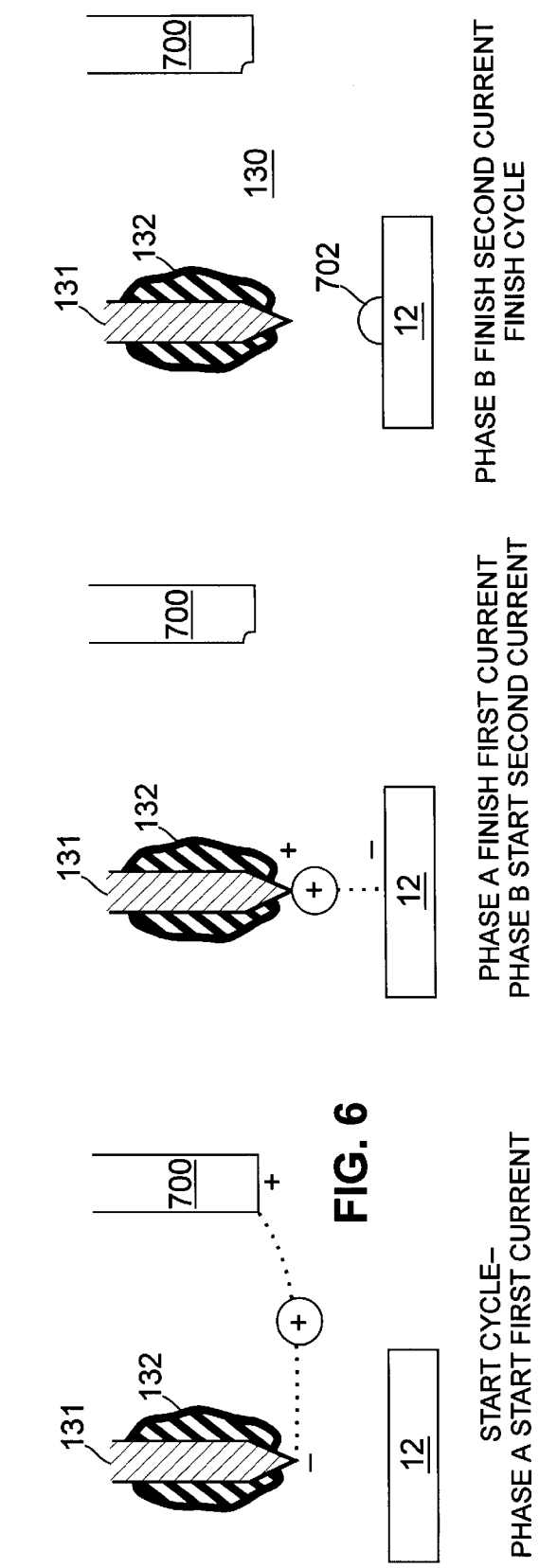
FIG. 4
FIG. 6

CONVENTIONAL PHOTOLITHOGRAPHY

NEAR-FIELD PHOTOLITHOGRAPHIC
MASKS AND PHOTOLITHOGRAPHY;
NANOSCALE PATTERNING TECHNIQUES;
APPARATUS AND METHOD THEREFOR

FIELD OF THE INVENTION

The present invention is directed to improvements in photolithography, more particularly to a nanoscale photolithographic mask, methods and apparatus for forming such masks, and near field photolithography using such masks, for example, in semiconductor processing and integrated circuit manufacture. The invention also has application to electroplating and electromilling of electrically conductive materials.

BACKGROUND OF THE INVENTION

Present commercial photolithography, more particularly photolithography for use in semiconductor processing, uses light to expose a substrate coated with a photosensitive material (also known as a "resist" coating) through a mask. The mask has an opaque pattern that blocks some of the light. The "resist" material that is sufficiently exposed to the light not blocked by the mask acquires a characteristic that is different from the resist that is blocked by the mask from the light. As a result, the exposed resist can be "developed," that is physically removed by a chemical processing to expose the substrate. The substrate is then processed by a semiconductor processing step, e.g., doping the exposed substrate with an "n" or a "p" material, or oxidizing the exposed substrate, it being understood that other processing treatments could be applied in a conventional manner. The portion of the substrate that remains coated by resist remains comparatively unaffected by this further processing. Then, the so-processed substrate is further processed to remove the remainder of the resist coating, leaving the substrate having an n, p, or oxidized material formed therein in the pattern of the mask. Thereafter, another resist coating may be applied, a different mask used to expose the resist and a different pattern of n or p material, or oxidation is formed in the substrate to form a different layer of material. By this technique of repeated photolithographic exposure through a mask and processing, the semiconductor material is formed into an integrated circuit (more specifically a plurality of integrated circuits) as is well known. Although the present invention is by no means limited to semiconductor processing to form integrated circuits, such techniques provide a useful framework for understanding the invention, as discussed below.

Current photolithography has a resolution with dimensions on the micrometer level. Stated otherwise, the smallest dimension of a line (such as a wire or lead connecting two circuit elements) that can be made using photolithography is approximately 0.2 micrometers. This dimensional limit controls the size of the circuit elements used in the semiconductor chip, and thus how many circuits can be formed in a given amount of real estate (circuit density). This in turn affects the cost of integrated circuits as well as the speed at which the circuits can operate and how much power is needed to operate the integrated devices.

Current efforts are being made to increase the resolution to below the micrometer level, more specifically, to the nanometer level. Advances, however, have been limited by the physics of light scatter and diffraction attributable to the wavelength of the light radiation used to expose the resist coated substrate through the mask. In this regard, the photolithographic masks are used in the far-field and conventional and commercial photolithographic techniques for manufacturing integrated circuits are Abbe-diffraction limited in their achievable resolution. This limits the size of features to be patterned on the substrate (namely, the semiconductor chips) to one-half the wavelength of the light used. Currently, the resolution is limited to a minimum dimension of about 0.2 micrometers. Attempts to move to shorter wavelengths of light have not shown much success. See, e.g., "The limits of lithography" *Scientific American* (September 1995), p. 66; and Stix, "Toward 'point one'" *Scientific American* (February 1995), pp. 90–5.

Due at least in part to the difficulties in improving resolution in photolithography, there also has been considerable activity using alternate techniques for forming masks and patterns in substrates for semiconductor processing. These include electromagnetic radiation in the x-ray region and electron beams. Although these technologies have met with some technical success, they involve other considerations, in particular time and cost, in their implementation that have inhibited widespread adoption of the technology, and, to date, prevented implementing forming masks and patterns with sub-micrometer resolution in mass production. The term "nanoscale" as used herein means a dimensional resolution of a pattern or a structure that is sub-micrometer, more preferably less than 0.2 micrometers in resolution.

There also exists a device known as a scanning probe microscope in which a high-precision actuator moves a miniature sensor over the surface of a sample. See, for example, Jefferson, "The imaging of individual atoms", *Science*, V. 274 (Oct. 18, 1996), p. 369. Because the sensor and the sample interact only over a very small area, the scanning probe microscope attains a high resolution that can image nanoscale structures. Among the many types of scanning probe microscopes which have been built are scanning tunneling microscopes ("STM"), atomic force microscopes, scanning electrochemical microscopes ("SECM") and scanning near-field optical microscopes. See, generally, Dror, *Scanning Force Microscopy: With Applications to Electric. Magnetic, and Atomic Forces*, Oxford University Press, (New York, 1991).

A scanning tunneling microscope (STM) senses quantum tunneling of electrons. Electrons tunnel between an atomically sharp wire tip and an electrically conducting sample. A piezoelectric ("piezo") transducer scans the tip across the surface of the sample in a raster pattern. In one implementation, the resulting changes in tunneling current are recorded. However, it is more common to use a negative feedback loop to vary the height of the tip in response to minute changes in the tunneling current. This keeps the tip's height above the sample, and the tunneling current, constant. The output of the feedback loop also gives a measure of the height of the sample's surface. This is described in Binnig et al., "Surface studies by scanning tunneling microscopy" *Physical Review Letters*, V. 49 (Jul. 5, 1982), pp. 57–61.

The tunneling current falls off exponentially as the distance between the tip and the sample increases. It has been demonstrated that, typically, the tunneling current decreases by about an order of magnitude for each additional Angstrom of separation between the sample and the tip. Guntherodt et al. (eds.), *Scanning Tunneling Microscopy I*, (Springer-Verlag, New York, 1992) ("Guntherodt"). This leads to the extremely high resolution of an STM.

STM theory is treated more fully in the published literature. See, e.g., Guntherodt; Volodin, "Tactile microscopes" *Quantum*, V. 3 (January/February 1993) pp. 37–40; Binnig et al., "Vacuum tunneling" *Physica*, 109 & 110B (1982) pp. 2075–2077; Binnig et al., "Surface studies by scanning tunneling microscopy" *Physical Review Letters*, V. 49 (Jul. 5 1982) pp. 57–61; and Dror, *Scanning Force Microscopy: With Applications to Electric, Magnetic, and Atomic Forces* (Oxford University Press, New York, 1991). The reader is referred to each of the foregoing references for further details on STM design theory and applications.

One proposal to solve the problem of increasing the feature density on silicon wafers is the use of scanning tunnelling microscopes ("STMs") and atomic force microscopes (AFMs) to pattern the surface directly. See, for example, Zhang et al., "Creation of nanocrystals through a solid-solid phase transition induced by an STM tip," *Science*, V. 274 (Nov. 1 1996), pp. 757–60; and "Atomic landscapes beckon chip makers and chemists," Report from the American Vacuum Society Meeting, *Science*, V. 274 (Nov. 1 1996, pp. 723) (the "AVS Report"). It has been shown that these microscopes can manipulate individual atoms to create nanoscale structures. Unfortunately, these microscopes are too slow to create the millions of integrated circuit chips, each with millions of transistors, required by the semiconductor industry. Attempts to create AFMs with multiple tips working in parallel have shown only limited success, as noted in the aforementioned AVS Report.

SUMMARY AND OBJECTS OF THE INVENTION

It is, therefore, an object of the invention to overcome the foregoing problems and achieve photolithography with improved resolution on a nanoscale dimension.

It is another object to provide a nanoscale mask for photolithography.

It is another object to provide apparatus and methods for creating a nanoscale mask for photolithography.

It is another object to provide near field photolithography for forming nanoscale patterns or structures.

It is another object of the invention to provide an electrochemical paintbrush that can be used to deposit on or remove from a conductive surface a material on a nanoscale dimension as well as on larger dimensions.

The present invention concerns developments related to a new field of technology, namely near-field photolithography, in which a pattern, opaque to the illuminating electromagnetic radiation, having a nanoscale resolution is made using a modified scanning tunneling microscope. The opaque material, preferably an electroplatable metal, is deposited on an electrically conductive material, e.g., a transparent sheet of indium tin oxide, as a plurality of deposits or "dabs" of the opaque material, having a nanoscale resolution. The patterned indium tin oxide is then used as a photolithographic mask in the optical near-field. Near-field resolution is not diffraction limited, and near-field photolithography is able to pattern objects with sub-wavelength resolution. As a result, smaller semiconductor microchips can be manufactured and a new nanotechnology, e.g., nanomachines, can be developed.

The scanning tunneling microscope (STM) is used as an "electrochemical paintbrush" to transfer the electoplateable material from a massive copper supply to the STM electrode tip, and then to the ITO surface. This occurs cyclically in an aqueous electrolyte solution of the electroplatable material, without degrading the STM electrode tip, and while maintaining the ion concentration of the opaque material in the solution constant.

The cycling can be reversed so as to remove an amount of electroplateable material from a specific area of a conductive surface, for example, to repair or modify a previously made nanoscale photolithographic mask, or to mill a portion of a conductive structure. The removed portion can be deposited on the massive supply or on a different area of the conductive surface. By selection of the current and other electroplating parameters, amounts of electroplatable material, from nanoscale to centimeter scale, can be deposited or removed, depending on the polarity of the current flow and the desired result. Above the nanoscale range, the STM and electrochemical tip as described herein can be replaced with a suitable inert electrode.

BRIEF DESCRIPTION OF THE DRAWINGS

Further features of the invention, its nature and various advantages will be apparent from the accompanying drawings and the following detailed description of the invention, in which like reference numerals refer to like elements, and in which:

FIG. 2B is a circuit schematic diagram of a raster scan generator of the control circuit of FIG. 1;

FIG. 2C is a circuit schematic diagram of a computer interface between the STM and the computer of FIG. 1;

FIG. 4 is a schematic drawing of a prior art process for forming a tip of the STM of FIG. 1 in accordance with the present invention;

FIGS. 6 and 6A are schematic drawings of a process for depositing an opaque material using the electronic paintbrush control circuit of FIG. 5, in accordance with an embodiment of the present invention;

DETAILED DESCRIPTION OF THE INVENTION

Figure 1:
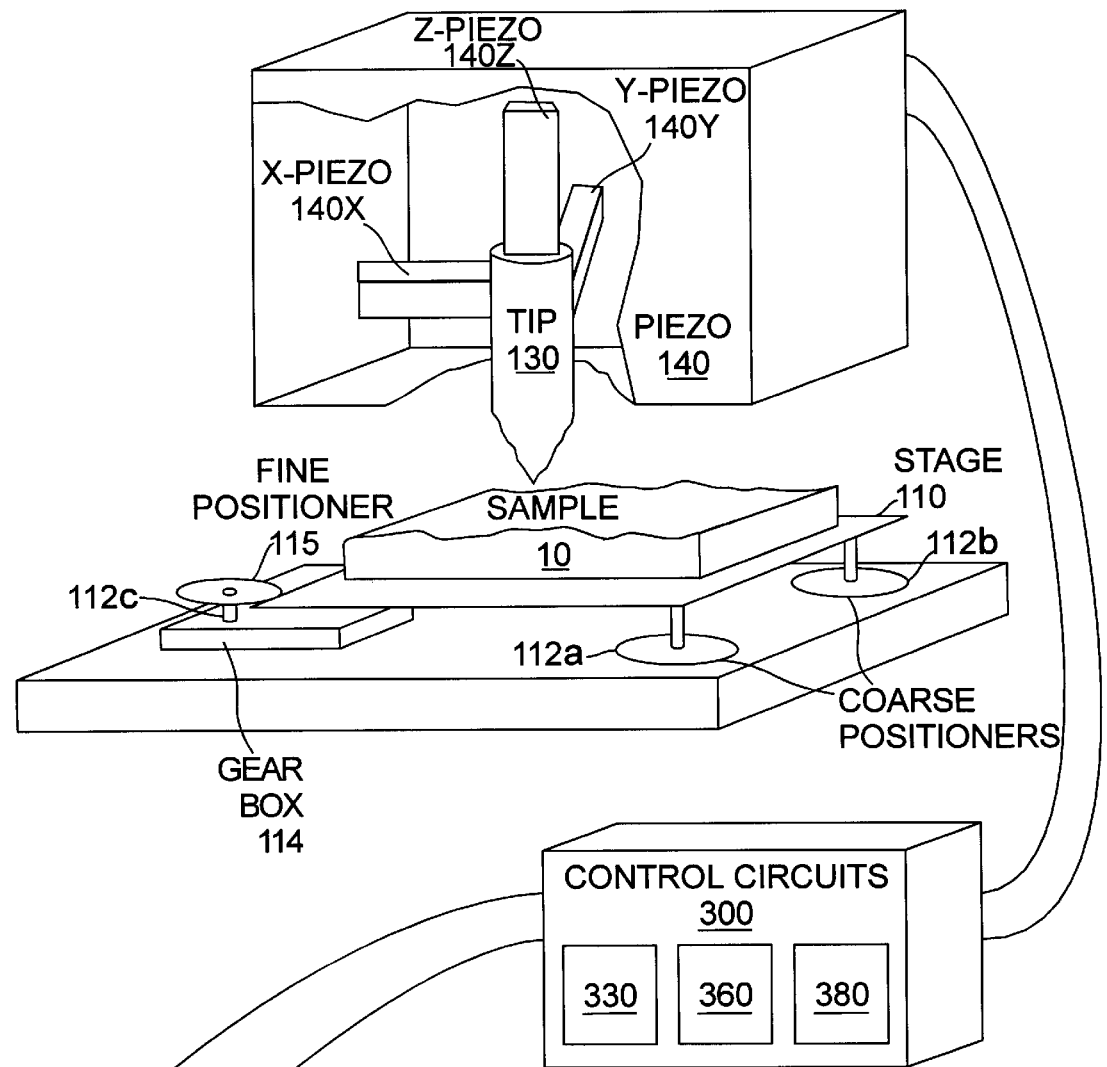
FIG. 1 is an elevated perspective view of an apparatus, including a scanning tunneling microscope (STM), and control circuits, for use in forming nanoscale photolithographic masks in accordance with a preferred embodiment of the present invention
Figure 1:
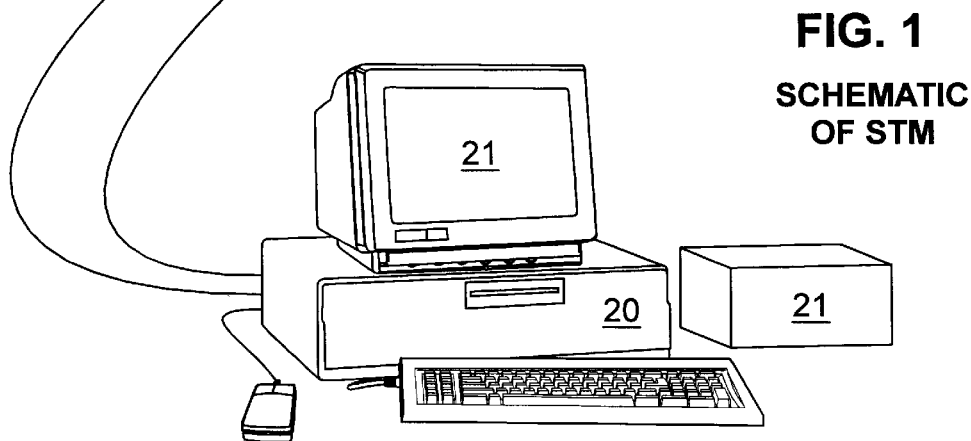

Referring to FIGS. 1 and 2, in accordance with the preferred embodiment of the present invention, an apparatus for forming nanoscale photolithographic masks is shown. The apparatus includes an STM 100 comprising a mechanical structure and is operated by a computer 20 executing control software and control electronics 300.

Scanning Tunneling Microscope

Referring to FIG. 1, the mechanical structure of an STM 100 includes a stage 110 for supporting a sample 10, a piezoelectric actuator 140 on which a tip 130 is mounted, a coarse adjustment and a fine adjustment for positioning the stage 110 relative to tip 130, and a housing or framework (not shown) on or to which the various components are mounted. The STM 100 is designed to work under ambient conditions and in an electrochemical environment and has two operating requirements. First, the stage 110 must be adjustable to a precision that is within a few hundred nanometers. Second, the STM 100 must be immune to vibrations from the environment.

The mechanical structure of the STM 100 by be any suitable material having a suitable structural rigidity to support the components and shield the sample 10 from ambient air currents. A conventional STM may be purchased, e.g., model Nanoscope I, II or III available from Digital Instruments. Alternately, one may be constructed using for structure, for example, a rigid plastic, such as a polyethylene, polycarbonate or polyurethane, or a metal such as stainless steel or a low thermal expansion alloy. An experimental prototype STM 100 was constructed using LEGO® building blocks (LEGO is a registered trademark of Interlego AG).

In a preferred embodiment, the stage 110 of STM 100 rests on three fine-pitch screws 112(a–c). Two of the screws 112a, 112b, can be manually turned for achieving a coarse adjustment of stage 110. By so adjusting these screws, it is possible to position the sample 10 to within about 5 micrometers of the tip 130. The third screw 112c is connected to a gear chain 114 which has a turning knob 115 on the end of the gear chain. The gear chain 114 is dimensioned so that a set number of rotations of the knob 115 causes one rotation of the screw 112c. This screw 112c, therefore, can be used to position finely the stage 110 to within about 100 nanometers of the tip 130. In the experimental prototype, 675 rotations of knob 115 resulted in one rotation of screw 112c. A conventional gear reduction system made from Lego, blocks was used in the experimental prototype, and any coventional system may be used in place of a chain driven system.

A piezoelectric actuator ("piezo") 140 is rigidly mounted to the frame and located above the stage 110. The piezo 140 is controlled to move the tip 130 in each of the x, y, and z directions (or axes), with a sensitivity of 34 angstroms/volt. As shown in FIG. 1, the piezo 140 may actually comprise three separate and independently controllable piezos 140x, 140y and 140z for controlling motion in the x, y and z directions, respectively. Although not shown, each piezo element 140x and 140y may have two such pieces disposed on axis, symetrical about the z axis.

To isolate against high frequency vibrations, the entire STM 100 frame is encased in about 7 kilograms of plasticine (a kind of modeling clay (not shown)). In addition, bungee cords (not shown) are used to suspend the STM 100 frame from a structure, such as a concrete ceiling, to isolate the STM 100 from low frequency vibrations. Bungee cords are elastic cords used to secure items from movement and are available at sporting goods and luggage stores. Other forms of mechanical vibration isolation could also be used.

Figure 2A:
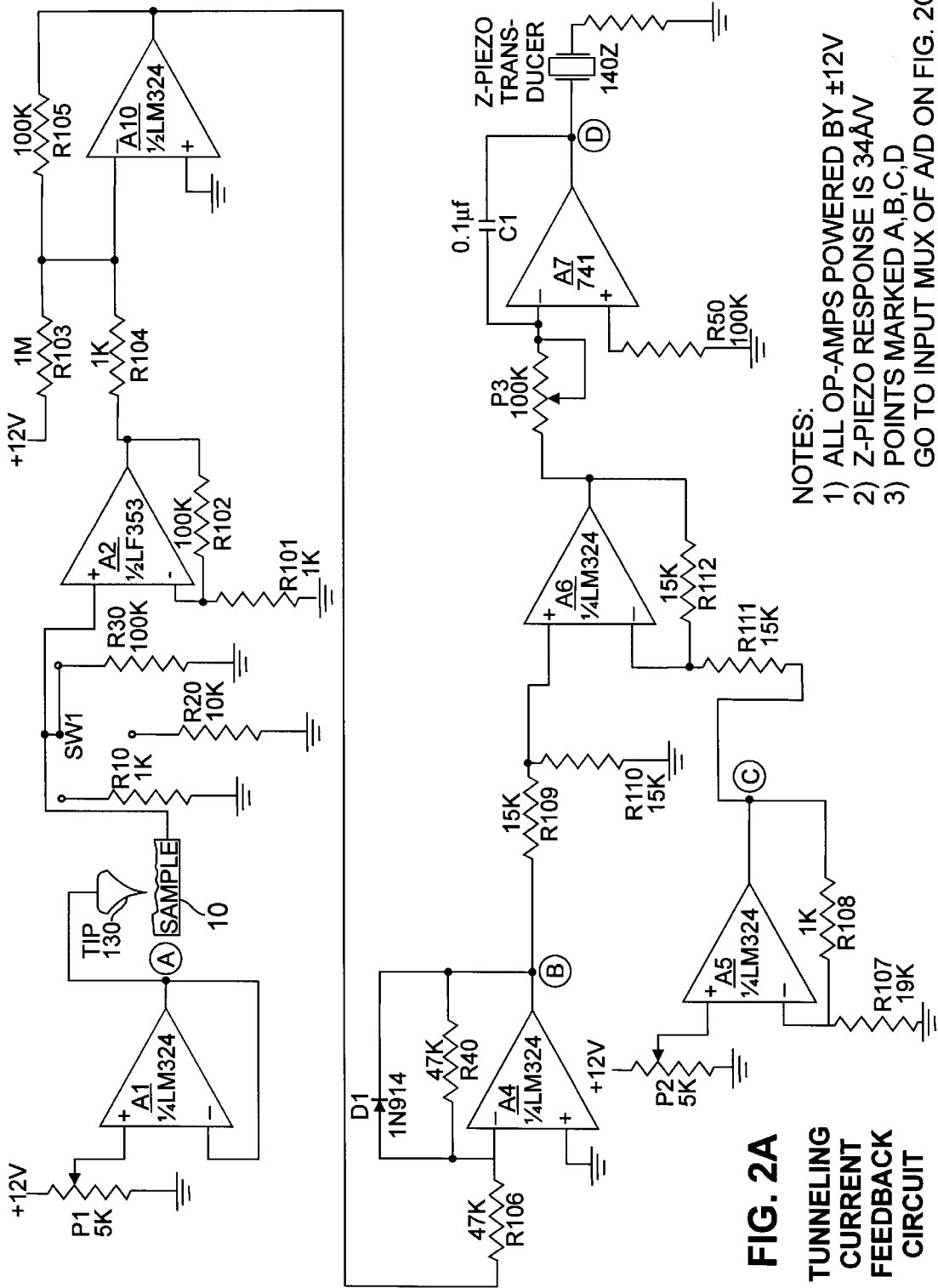
FIG. 2A is a circuit schematic diagram of a z-piezo feedback circuit of the control circuit of FIG. 1.

Referring to FIGS. 1, 2a and 2c, control software suitable for operating the STM 100 may be custom written, for example, in the QBasic programming language. In addition, a data analysis software routine may be written in the Matlab programming language. The specific programs may be designed in any of a number of ways, within the abilities of a person of ordinary skill in the art.

The control software thus provides a program that functions to monitor in real time the x, y, and z coordinates of the tip 130, the bias voltage $V_B$ applied between the tip 130 and the sample 10, a desired tunneling current IT which is set manually using a potentiometer P2, and the actual tunneling current $I_{Tact}$. The software is preferably written to record data in either a constant height mode or in a constant current mode. The data analysis software includes routine functions to process the data and display the results of the scans (see FIGS. 3, 8A, 8B), and can preferably perform a Fourier analysis to try to separate the signal from the noise. A monitor 21 and/or a printer 22 can be connected to computer 20 to display and or printout the recorded data.

Referring now to FIGS. 1, 2A–2C, the control circuit 300 includes a z-piezo feedback circuit 330 which functions to maintain a steady tunneling current $I_{Tact}$, a raster scan generator 360 which functions to move the tip 130 in a desired raster scan, e.g., in the x and y directions, and a computer interface 380 which functions to acquire data for monitoring and/or controlling the operation of STM 100.

Referring to FIG. 2A, the z-piezo feedback circuit 330 monitors the actual tunneling current $I_{Tact}$ and adjusts the vertical position, in the z axis, of the tip 130 to try to maintain the tip 130 a predetermined distance, that is a constant height, above the sample 10, and thereby to maintain a steady tunneling current $I_{Tact}$. Circuit 330 includes a bias voltage amplifier A1 coupled to the tip 130, a preamplifier A2 coupled to the sample 10, an amplifier gain stage comprising amplifiers A3 and A4 coupled to the preamplifier A2, a reference current signal provided by amplifier A5, an error signal differential amplifier A6, and an RC integrating amplifier A7. Amplifier A1 is a preferably a model LM324 operational amplifier ("op-amp") which follows the voltage set on potentiometer P1, (a 5K potentiometer) by the +12 v source, allowing a bias voltage $V_B$ of between 0 V and +10 V to be applied to the tip 130. The bias voltage $V_B$ is measurable at node A. Typically, bias voltages range from 100 mV to 2 V. A switch SW1 is provided along with three resistors R10, R20, R30 to connect selectively the sample 10 to ground to convert the tunneling current $I_{Tact}$ into a voltage $V_B$ to be measured by amplifier A2, e.g., a high-impedance JFET op-amp (model LF 353). The three resistors R10, R20, R30, respectively 1K, 10K and 100K, do not appreciably alter the voltage drop $V_B$ between the tip 130 and the sample 10 because a maximum tunneling current of 10 nA would only generate a 1 mV drop across the 100K resistor R30.

Amplifier A2 amplifies the current signal $I_{Tact}$ by a factor of 101 through use of a resistor divider R101 (1K) and R102 (100K) in the feedback loop, and amplifier A3 further amplifies the signal by a factor of −100 using resisters R104(1K) and R105 (100K), and a 12 v source supplied across resistor R103 (1M) is added to the output of amplifier A2. Amplifier A3 also is preferably a model LF353 op-amp. Amplifier A4 (model LM324) inverts the signal with unity gain (using resistors R106 and R40 (each 47K)), returning it to its original polarity. Through resistor R40 and diode D1 (model 1N914) in the feedback loop, amplifier A4 also removes the positive part of the signal output from amplifier A3. This is because any positive signal from amplifier A3 must come from noise and is therefore to be suppressed.

The goal tunneling current $I_T$ is set using potentiometer P2 (a 5K potentiometer coupled to +12 V), and amplifier A5 (a model LM324 op-amp). The goal current $I_T$ is measurable at node C at the output of amplifier A5. Amplifier A5 also is configured with resisters R107(19K) and R108(1K) to scale its output to appropriate values. Amplifier A6 (a model LM324) subtracts the signal from amplifier A5 output across a resister divider of resistors R111 (15K) and R112 (15K), representing the goal current $I_T$, from the signal $I_{Tact}$ across the voltage divider of resistors R109 (15K) and R110 (15K), representing the actual tunneling current. Thus, the output of amplifier A6 is a measure of the error in the tunneling current. This error signal is passed to the integrator amplifier A7, a model 741 op-amp having a 0.1 µf capacitor C1 in the feedback loop, and a potentiometer P3 at the inverting input and a resistor R50 (100K) at the noninverting input. The integrator A7 thus has a variable time-constant, which is set by adjusting potentiometer P3. Too high a time-constant leads to an unstable tunneling current, while too low a time-constant can lead to oscillations. The ideal value of the time-constant is to be empirically determined, and depends on the amount of acoustical noise and the conditions of the tip 130 and sample 10. These factors can change from minute to minute as well as from sample to sample. Computer 20 can be programmed to adjust digitally potentiometer P3 as appropriate, to maintain an appropriate time constant.

Figure 3:
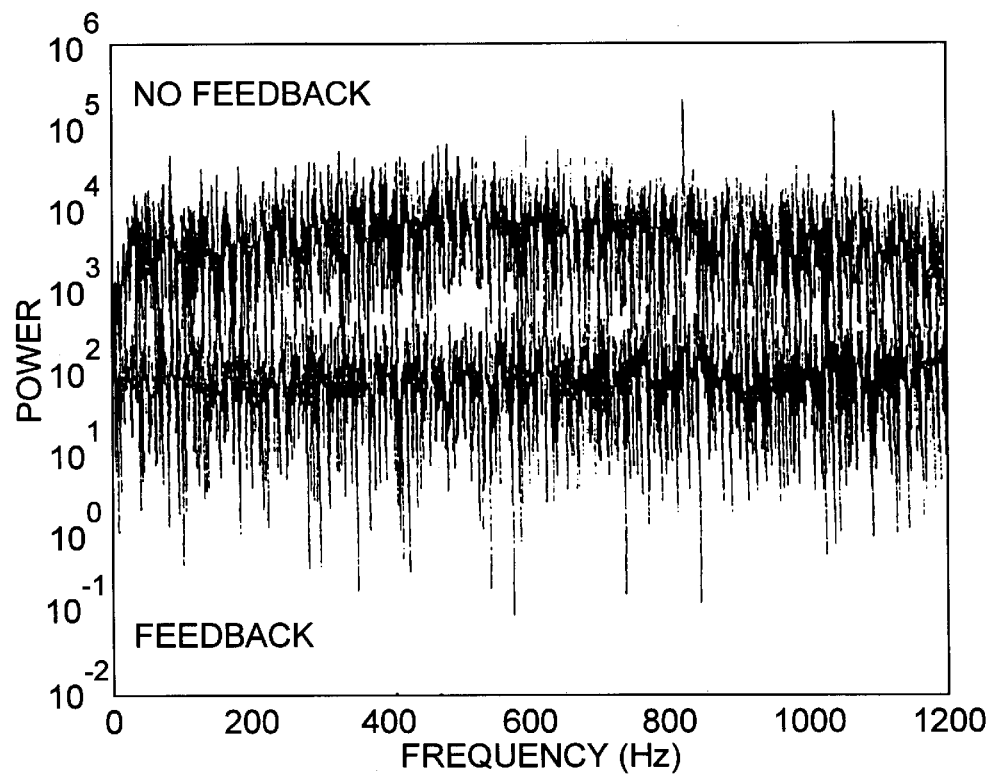
FIG. 3 is a graph showing two representative plots of the power spectral density of tunneling current noise, the top plot being without active feedback and the lower plot being with active feedback, the plots having a logarithmic y-axis in power and a linear x-axis of frequency in Hertz.

The output of the integrator A7, which is measurable at node D, drives the piezo 140 in the "z" direction. This moves the tip 130 toward or away from the sample 10 in the z axis. If the tunneling current $I_{Tact}$ is too high, the integrator A7 operates to draw the tip 130 away from the sample 10; if the tunneling current $I_{Tact}$ is too low, the tip 130 is moved closer to the sample 10. FIG. 3 shows the effect of the active feedback circuit 330, on the electrical noise in the tunneling current. It is noted that the use of the feedback loop decreases the power of the noise by a factor of approximately 61.

Referring to FIG. 2B, the raster scan generator circuit 360 produces a raster pattern of motion in the x and y directions, similar to the scan lines on a television screen. Raster scan generator circuit 360 generally has two triangle wave generators, one for controlling motion in each of the x and y directions, which have different operating frequencies. This is so that the tip will traverse the y dimension range before it is advanced in the x direction. Polarity inverter amplifiers are respectively connected to the triangle wave generators to obtain both x and y direction motion control signals of opposite polarity to control piezo 140.

In a preferred embodiment, the triangle wave generator is constructed of amplifiers A8 and A9 (models LM324 op-amps) configured with resistors R210 (15K) and R212 (10M) and capacitor C210 (0.7 µf) to produce a lower frequency triangle wave which drives the piezo 140 in the x-direction. The output of amplifier A9 is measurable at node E. The low frequency may be from 1 to 0.01 Hz, more preferably 0.1 Hz. Amplifiers A11 and A12 similarly combine with resistors R310 (15K) and R312 (1.0M) and capacitor C310 (0.1 µf) to produce a higher-frequency triangle wave to drive the piezo 140 in the y-direction. The output of amplifier A11 is measurable at node F. The higher frequency may be from 1 to 100 Hz, more preferably 10 Hz. The outputs of the two triangle-wave generators are respectively inverted by amplifiers A10 and A13 (each model LM324) having a gain of −1 using resistors R214 and R215, and R314 and R315 (15K each).

The outside of the piezo 140 is divided into four quadrants 140x+, 140x−, 140y+, 140y−. In the x and y directions, opposite quadrants of the piezo 140 (x+ and x−) and (y+ and y−) are driven by triangular wave signals of opposite polarity. This prevents the piezo 140 from moving in the z-direction in response to the signals intended to move it in the x and/or y directions.

Referring to FIG. 2C, to record data from the STM 100, a special-purpose computer interface 380 was designed and built, although a commercially available interface also could have been used. The computer interface 380 may be of any construction which allows the computer 20 to monitor several parts of the STM control circuit 300 in cooperation with the control and data acqusition software. Computer 20 is a conventional personal computer, e.g., a 486 or Pentium class microprocessor based system having a keyboard, printer, mouse, display and disk drives.

The computer interface circuit 380 has a decoder circuit 383 which functions in a conventional manner to decode an address signal from the computer bus 382 on address lines A0–A7. The decoder circuit 383 includes And gates G1, G2, G3, G4 and G5, and inverters I1, I2, I3, I4 and I5, which are configured as shown to decode the address as described herein. If the address is correct (H2FF) and the Input/Output Write ("IOW") line 384 is asserted low, the computer 20 sends a control word to the interface 380 on bus 379 (data lines DO–D7). In the designed embodiment, 8 bit words are used. Data bits 0, 1 and 2 of the control word determine the state of the 8-channel analog multiplexer 386. A suitable multiplexor device is a model 4051 available from National Semiconductor. The multiplexer 386 switches one of the signals from the six monitoring nodes A, B, C, D, E and F in the circuit 300 (see FIGS. 2A and 2B) through the signal conditioning input port 378 to the input of an analog-to-digital converter (A/D) 388. A/D 388 may be, for example, a model ADC0804LCN device. The six nodes provide the x (node E), y (node F), and z (node D) coordinates of the tip 130, the bias voltage $V_B$ (node A), the desired tunneling current $I_T$ (node C), and the actual tunneling current $I_{Tact}$ (node B).

A data latch 385 is interposed between, on the one hand, data bus 383, and, on the other hand, the control inputs of analog multiplexor 386, an A/D range select circuit 389, and an A/D offset select circuit 387. The latter two circuits are used to control the range and offset operation of multiplexor 386.

In a preferred embodiment, the control data word includes bits to select the range and offset of the voltages that the A/D 388 is able to convert. Data bits 3, 4 and 5 of the control data word are used to select from among eight possible A/D input ranges. The values of the ranges are selected in circuit 389 by varying potentiometers P4, P5 and P6 (each being a 100K potentiometer connected to the data bits 3, 4, 5 respectively, with the outputs being summed by amplifier A18 (a model LM324 op-amp) and inverted by amplifier A19 (a model LM324 op-amp) having unity gain by use of resisters R400 and R401 (3.9K each). A resister R402 of 3.0K is applied in the feedback of amplifier A18.

In offset select circuit 387, data word bits 6 and 7 are input and used to select from among four A/D offset voltages. This is achieved by selectively combining resistors R403 and R404 having 10K and 18K respectively, as selected by the value of data bits 6 and 7. The outputs are summed at the inverting input of amplifier A20 (a model LM324 op-amp) and inverted by amplifier A21 (a model LM324 op-amp). A 5.1K resistor R405 is in the feedback of amplifier A20, and amplifier A21 has resistors R406 (8.2K) and R407 (10K) coupled to the inverting input as shown in FIG. 2C.

Thus, under software control, by appropriate selection of circuit element values, the computer 20 can digitize signals in almost any range with a full eight bits of resolution. The computer 20 also can use different range and offset values for each of the six signals that the computer 20 monitors. It should be understood that the potentiometers P4–P6 may be digitally controllable devices.

When the computer address bus 382 presents address H2FF and the IOR Input/Output Read ("IOR") line 390 is asserted low, the A/D 388 sends to the computer data bus 381 the digitized value of the selected analog voltage at its input.

As will be appreciated by persons skilled in the art, the circuit configuration and component values selected in the exemplary embodiment described above can be modified in numerous ways to obtain the same results, and further, that different circuit elements, devices and structures can be connected to achieve the same performance or results as in the exemplary embodiment depicted in FIGS. 2A–2C and described herein. It also is noted in the drawings depicted that +12 v is used as a supply voltage, the operational amplifiers are biased between +12 v and –12 v, and the digital circuit chips are driven by +5 Vcc and grounded, which voltages, V, Vcc, and ground connections are not always shown for clarity of presentation.

It is noted that the experimental prototype STM 100 described above was designed and constructed with most of the features of a commercially available device, but cost approximately $50 to build (excluding the cost of computer 20, piezo 40, the LEGO blocks, and software licenses). The STM 100 succeeded in generating the pictures depicted in FIGS. 3, 8A and 8B. Further, it is noted that some of the analog signal processing could be performed digitally under software control and processing of the digitalized data, provided that the software has sufficient speed and power.

Copper Deposition on Indium Tin Oxide

The STM 100 described above is provided with a tip 130 that is suitable to perform electrochemical studies. Nichols, "Scanning probe microscopy studies of copper electrodeposition," Gewirth et al., *Nanoscale Probes of the Solid/Liquid Interface*, (Kluwer Academic, Boston, 1995), pp. 163–182; and Wenjie Li et. al., "Electrochemical deposition of metal nano-disk structures using the scanning tunneling microscope," Gewirth et al., *Nanoscale Probes of the Solid/Liquid Interface*, Kluwer Academic, (Boston, 1995), pp. 183–192. In accordance with the present invention an electrochemical paintbrush control circuit 500 also is provided to control the operation of STM 100 with the electrochemical tip 130. The STM 100 was then used to electroplate copper from a copper sulfate solution onto an indium tin oxide ("ITO") sample, as will be presently described.

It is recognized that when a conventional STM electrode having a tungsten tip is immersed in an electrolytic solution, ionic currents completely swamp any tunneling current (See Gewirth et al., *Nanoscale Probes of the Solid/Liquid Interface*, (Kluwer Academic, Boston, 1995). Ionic currents are not limited to the few atoms at the very end of the tip, but can flow from any part of the electrode that is in contact with the solution. Thus, the STM tungsten tip loses all spatial resolution when placed in an electrically conducting liquid.

This obstacle is overcome in the present embodiment by use of a tip 130 adapted for electrochemical applications (also called an "electrochemical tip"). In this regard, a platinum wire is used in place of the standard tungsten in the tip 130 of the original STM, because platinum is relatively inert in electrochemical solutions. Other similarly inert metals could be used.

More specifically, referring to FIG. 4, an electrochemical tip 130 is prepared by obtaining a platinum wire 131, which is provided with an atomically sharp point or a close to atomically sharp point (step 1) and dipping the point in hot paraffin 132 (step 2), so that the end of the wire 131 acquires an insulating coating of paraffin 132 (step 3). The insulated platinum electrode 130 is then mounted on the piezo actuator 140 of STM 100.

A peltier thermoelectric module 600 is then mounted on the stage 110 and the paraffin coated tip 130 is brought into contact with module 600 (steps 3, 4). Module 600 heats the paraffin 132 around the platinum tip 130. The top of the peltier thermoelectric module 600 is covered with aluminum foil 610, which is connected to the input of a current sensing preamplifier 625. The paraffin-coated tip is slowly pushed into the top of the thermoelectric module 600 (step 4). This may be done manually or under piezo control. The heat from the peltier module 600 makes the paraffin pliable. As soon as the platinum wire 131 pokes through the paraffin 132, current flows from the platinum tip 130, through the aluminum foil 610 on top of the heater 600, and into the preamplifier 625 which produces an output indicative of the current flow e.g., illuminates an LED or light bulb. The thermoelectric module 610 is then immediately shut off and the tip 130 is advanced no further.

This procedure leaves almost the entire wire 131 covered with an insulating layer of paraffin 132. Only a tiny area on the tip 130 of the platinum wire 131 is left exposed. Since ionic currents can only flow from the tip of the exposed wire 131, the spatial resolution of the STM 100 is thereby maintained in an electrolytic solution. (See, e.g., Fu-Ren Fan et al., "Single Molecule Electrochemistry", *Journal of the American Chemical Society*, V. 118, (Oct. 9, 1996) pp. 9669–9675.

The STM 100 of the present invention is advantageously used to deposit an opaque electroplatable material on a sample that has an electrically conductive surface, such as ITO. It should be understood, however, that virtually any electrically conductive material may be used in place of ITO. To create a nanoscale photolithographic mask, in accordance with the present invention, it is important to keep the opaque deposit uniform, and to achieve this in the electrochemical system it is necessary to maintain a constant concentration the ionic form of the opaque material in the electrochemical plating solution 50. As recognized by the inventor, where the opaque material selected is copper, which example is used in the discussion following, if the anode in an electroplating bath of, e.g., copper sulfate is made of copper, copper from the anode will go into solution to replace the copper being deposited on the cathode, namely the electrically conductive surface 12 of sample 10. However, an STM tip made of copper would not work well in this situation because the tip would gradually dissolve in use.

Figure 5:
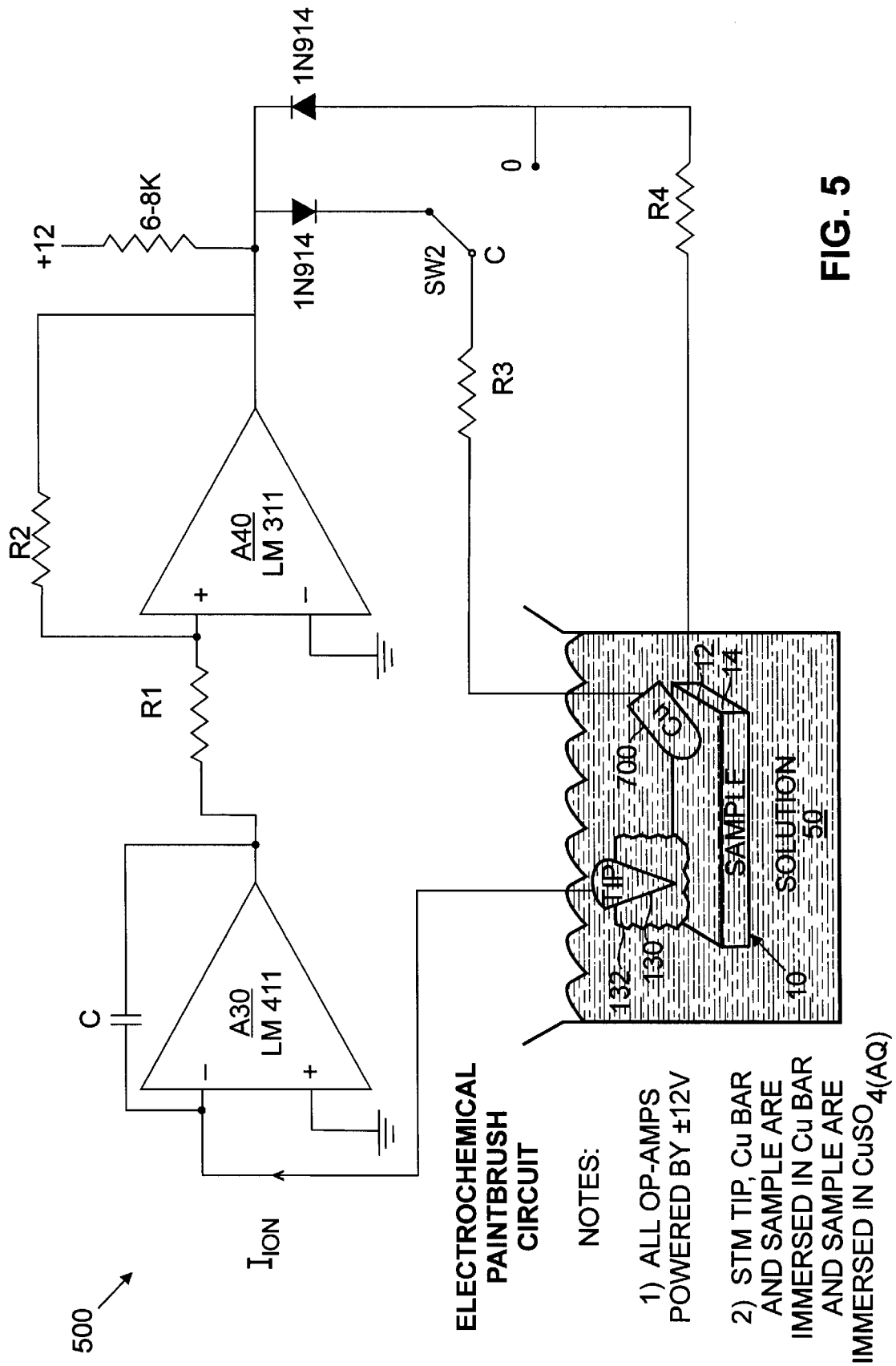
FIG. 5 is a circuit schematic diagram of an electrochemical paintbrush control circuit in accordance with an embodiment of the present invention.

To circumvent this problem, with reference to FIG. 5, a large copper electrode 700 is placed in the solution 50 along with the platinum electrochemical tip 130 and the indium tin oxide (ITO) layer 12 of sample 10. The electrochemical paintbrush circuit 500 functions to keep the copper ion concentration constant, while allowing precise control of the deposits. It does so by controlling the electroplating current so that the net current flow out of tip 130 is zero (or negligible).

In a preferred embodiment, the circuit 500 has two modes of operation and the operating mode is selectable by a switch SW2. Switch SW2 may be operable manually or under computer control. In the first mode, if the switch SW2 is open (o), no copper is deposited anywhere. In this mode, the circuit 500 merely monitors the electrical resistance of the solution 50. If the switch SW2 is closed (c), then in a first phase current and copper ions flow from the large copper electrode 700 to the tip 130, and in a second phase current and copper ions flow from the tip 130 to the ITO 12. With the switch SW2 closed, the platinum tip 130 acts like a paintbrush: the tip 130 picks up an amount of copper from the copper electrode 700 and then electrochemically transfers it to the ITO 12, without being permanently changed by the electrochemical process. This advantageously prevents degradation of tip 130 and permits the use of a large mass of copper in electrode 700.

When SW2 is in the open position, the circuit is functionally the same as the triangle-wave generating circuits illustrated in FIG. 2B and described above. As a result, an alternating current flows through the platinum electrode 130. Any electrochemical reaction which takes place during one half-cycle of the current flow is reversed during the other half-cycle. Thus, there is no net reaction.

Figure 6A:
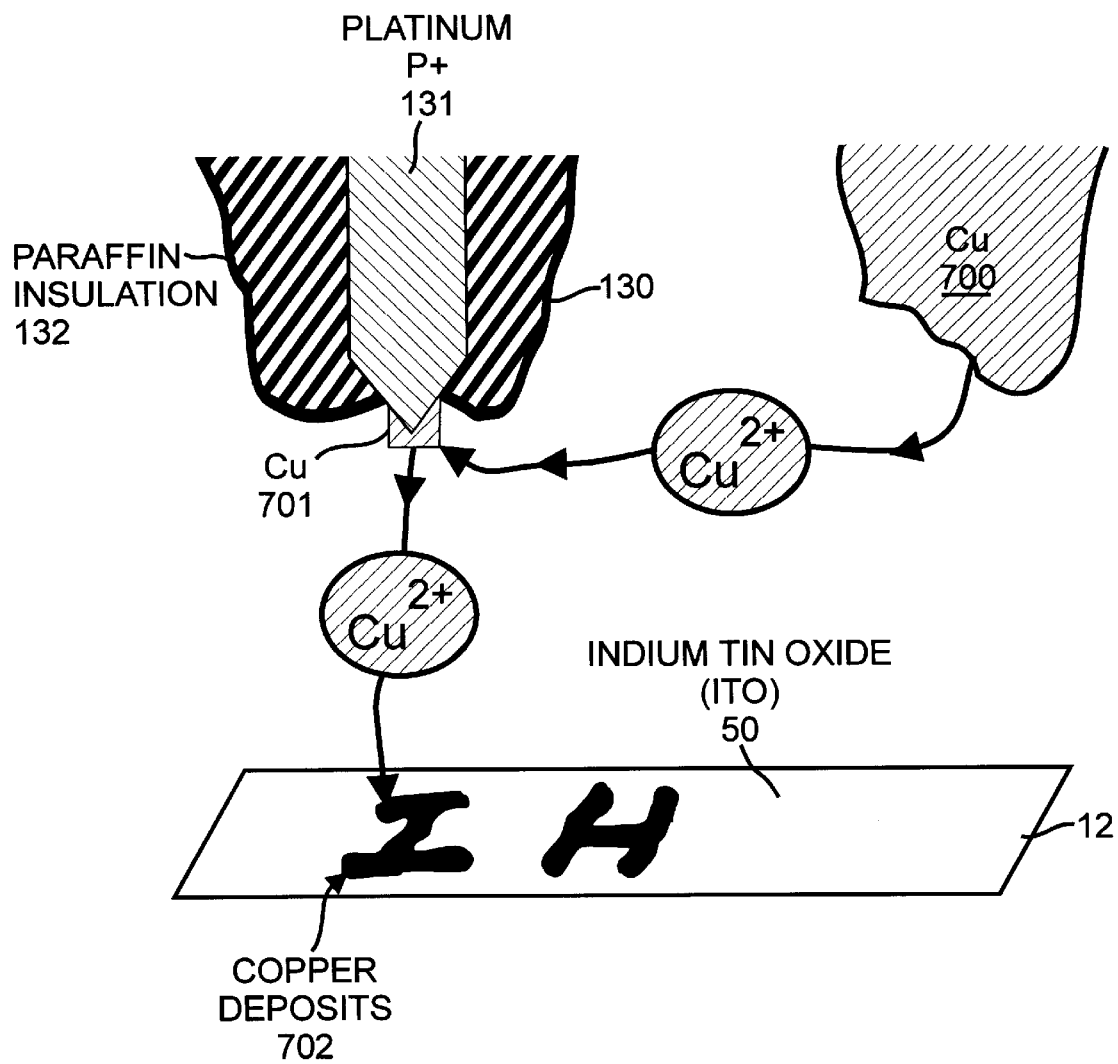

With SW2 closed, the circuit 500 is in its second or painting mode. With reference to FIGS. 5, 6 and 6A, in phase A when the output of amplifier A30 (a model LM 412 op-amp) is high, the large copper electrode 700 becomes an anode, the platinum tip 130 a cathode, and the ITO 12 is disconnected (isolated from the electrochemical system). A small amount or "dab" of copper 701 is transferred over time from the copper electrode 700 to the platinum tip 130 by action of an ionic current $I_{ion}$ (FIG. 5). More specifically, copper from copper electrode 700 goes into solution and copper ions in the solution plate out on tip 130. Amplifier A30 functions to measure the charge flowing into the platinum electrode. Once a certain amount of charge has flowed, comparator A40 (a model LM 311 comparator) switches states. The amount of charge, and hence the amount of copper 701 (that is, the size of the dab), can be selected by appropriate choices of the circuit and electrochemical parameters, as will be explained. Thus, at the end of phase A, when amplifier A40 goes low, phase B begins, the copper electrode 700 is disconnected, the STM tip 130 becomes the anode, and the ITO coating 12 becomes the cathode. The dab of copper 701 on the STM tip 130 then goes into solution, while a dab 702 of equal size is deposited on an area of ITO 12 that is proximate to tip 130. This circuit 500 provides that the average current flow out of the STM tip 130 is 0, and that the concentration of the copper sulfate solution remains constant.

Figure 7:
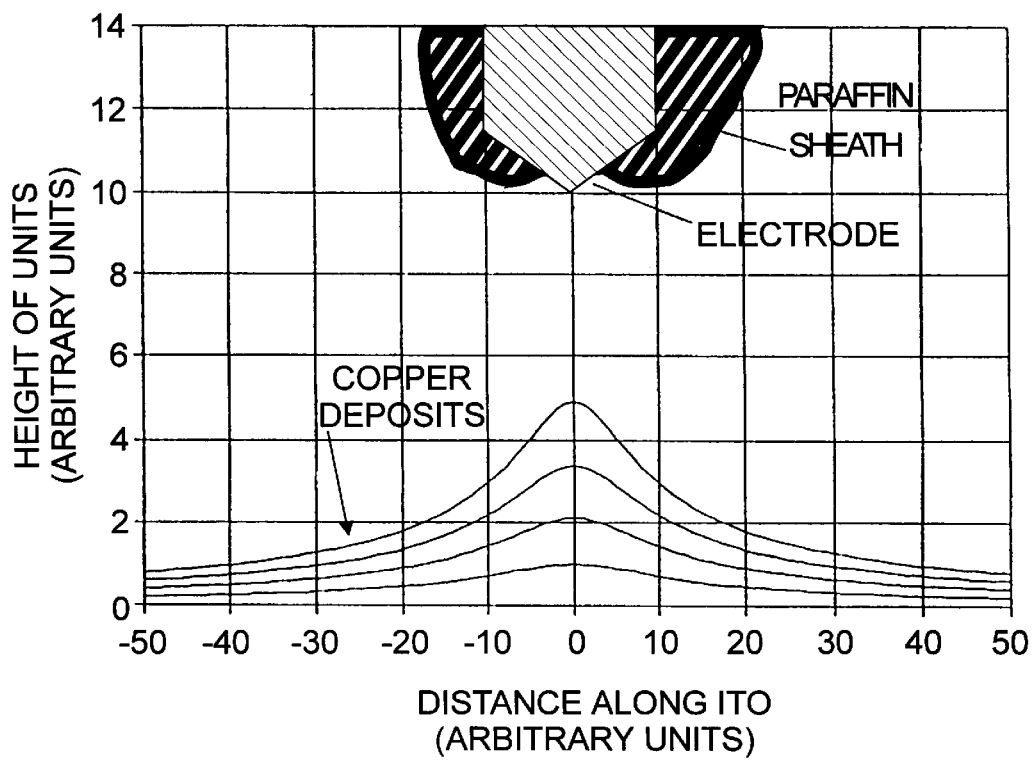
FIG. 7 is a graph showing a calculated simulation of copper deposition, having units of distance along the ITO on the x axis and height of the deposition along the y axis.

The number of moles of copper deposited as a dab 701 or 702 during each cycle is given by the formula:

$$n = \frac{V_S C (R_1 R_4)}{2F(R_2 R_4 + R_2 R_3 + R_3 R_4)}$$

where n is the number of moles of copper deposited, Vs is the supply voltage of the comparator, F is 96,500 (the number of coulombs in a mole of electrons), and C and $R_x$ refer to the capacitor and resistors on the circuit diagram illustrated in FIG. 5. If Vs=10 V, C=1 nf, $R_1=R_4=1K$, $R_3=10K$, and $R_2=100K$, each cycle will deposit $4.7 \times 10^{-17}$ moles of copper. This small quantity deposits a dab 702 that is approximately 70 nm across and should allow extremely high-resolution (nanoscale) patterning of the ITO surface. The period of each deposition cycle is proportional to $R_5$ and $R_6$, and inversely proportional to C. A calculated cross-section of a copper deposit on ITO for four successive current phases is shown in FIG. 7. The units are arbitrary and show the height (y-axis) vs. distance along the ITO (x-axis). A suitable range of copper dabs to be deposited per cycle is $1 \times 10^{-17}$ to $1000 \times 10^{-17}$ moles. Thus, in patterning a surface a single dab 702 may be applied to a given area of the ITO 12, or multiple dabs 702 can be applied to the same area, whether or not the multiple dabs 702 are deposited in succession.

This setup benefits from both the high resolution of the platinum tip 130 and the large reservoir of copper in the copper electrode 700. Inspection with an optical microscope verified that the experimental tip 130 was not affected by this cyclic transfer process, which is also referred to as the electrochemical paintbrush technique. This paintbrush setup is believed to be useful in other high-resolution and non-high resolution electrochemical procedures.

Advantageously, the paintbrush technique does not require actual contact between the tip 130 and the ITO 12, but rather a uniform spacing as controlled by the z-axis feedback control circuit 330. This prolongs the life of tip 130 and minimizes any degradation to ITO 12 prior to or after copper deposition. This also permits correcting defective depositions while minimizing the likelihood of causing further defects due to contact between the tip 130 and the ITO 12. In this regard, with switch SW2 open, computer 20 can operate STM 100 to inspect the ITO layer 12 and measure the copper that has been deposited, or locate a particular location in a given pattern, for example, to verify the correctness of the deposition pattern or to repair a portion of the pattern that was omitted or incorrectly applied. A correction may be made at an identified site by closing switch SW2 and either applying additional copper dabs, if appropriate, or reversing the current polarity while the tip 130 is at the area of the misapplied copper, so that the copper incorrectly deposited on the ITO 12 may be placed back into solution and ultimately onto tip 130 (for redeposit onto either another area of ITO 12 or copper electrode 700). Thus, a mask containing an error can be repaired by reversing the process by which the misapplied copper was originally deposited, rather than having to construct another mask. Similarly, if a circuit constructed according to a nanoscale mask turns out to be defective, the mask can be corrected rather than a completely new mask constructed. This is particularly advantageous when multiple or redundant circuits are to be patterned into a semiconductor using a common mask, but it turns out that some of those circuits can be left out. By fixing the mask, leads to the unneeded or needed circuits can be permanently open circuited or shorted, as the case may be, without having to prepare a new mask.

EXAMPLE

A plastic substrate 14, was coated with a layer 12 of indium tin oxide (ITO) and used as the sample 10 in the apparatus described above. ITO is a transparent electrically conductive material and is well known. It has previously been used in electrochemistry experiments (See, e.g., Fu-Ren Fan et al., "Single Molecule Electrochemistry", *Journal of the American Chemical Society*, V. 118, (Oct. 9, 1996) pp. 9669–9675. ITO is commonly used as the front surface electrode in liquid crystal displays and electrochromic products, such as automatically darkening rear view mirrors used in automobiles. The sample of ITO used in this example was obtained from an electroluminescent strip in a photocopier machine. As recommended elsewhere (e.g., Feifer, *Experimental Chemistry: The Hows and Whys of Chemistry*, Arco Publishing Co., New York, 1975), the plating solution 50 was an electrolyte having a 0.31M copper sulfate solution with 4.0 grams/liter of laboratory-grade gelatin dissolved in it to increase the uniformity of the deposits. The ITO layer 12 was approximately 50 μm thick.

The plastic substrate 14 was made of plexiglass, and was optically transparent.

The experiment started with switch SW2 open, and the tip 130 approaching the sample 10. As the tip 130 approached the ITO layer 12, the oscillations of amplifier A30 had a higher and higher frequency. If the tip 130 touched the ITO 12, the oscillations stopped. When the tip 130 was positioned so that it almost touched the ITO 12, having oscillations of approximately 500 Hz, and the switch SW2 was closed, copper started to come out of solution on the ITO 12. Patterns are drawn on the ITO 12 with the copper deposits by applying voltages to the x and y piezo transducers 140x and 140y to obtain a raster scan. In this regard, the triangular wave generators discussed above in raster scan circuit 360 are used. The paintbrush control circuit 500 is then operated to apply or not apply current to "paint" a plurality of dabs of copper in a predetermined pattern onto a plurality of areas of the ITO 12. The paintbrush current control may be achieved by opening and closing switch SW2 at appropriate times to deposit or not deposit a dab of copper on a given area according to the pattern to be formed, or by drawing the pattern as the tip 130 traces out the pattern in a non-raster scan mode, similar to an ETCH-A-SKETCH toy (ETCH-A-SKETCH) is a trademark of Ohio Arts) except that the tip can be moved from one area to another without depositng material therebetween. Thus, a pattern to be deposited on the ITO 12, one dab 702 at a time, can be programmed into computer 20 and formed in sample 10. The data can be stored as timing intervals for the square wave generators and switch SW2. Alternatively, a bit map of x, y coordinates and switch SW2 positions, or a sequence of x, y coordinates and switch SW2 positions, can be used to define the pattern in memory.

Figure 8A:
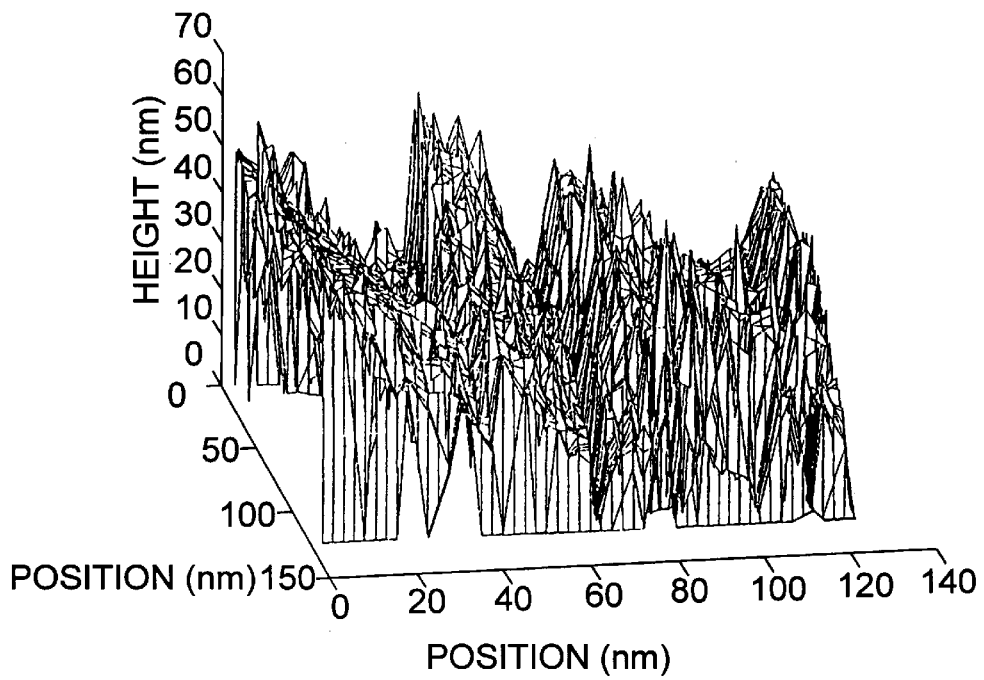
FIGS. 8A and 8B are respectively scans of an ITO surface before and after deposition of copper.
Figure 8B:
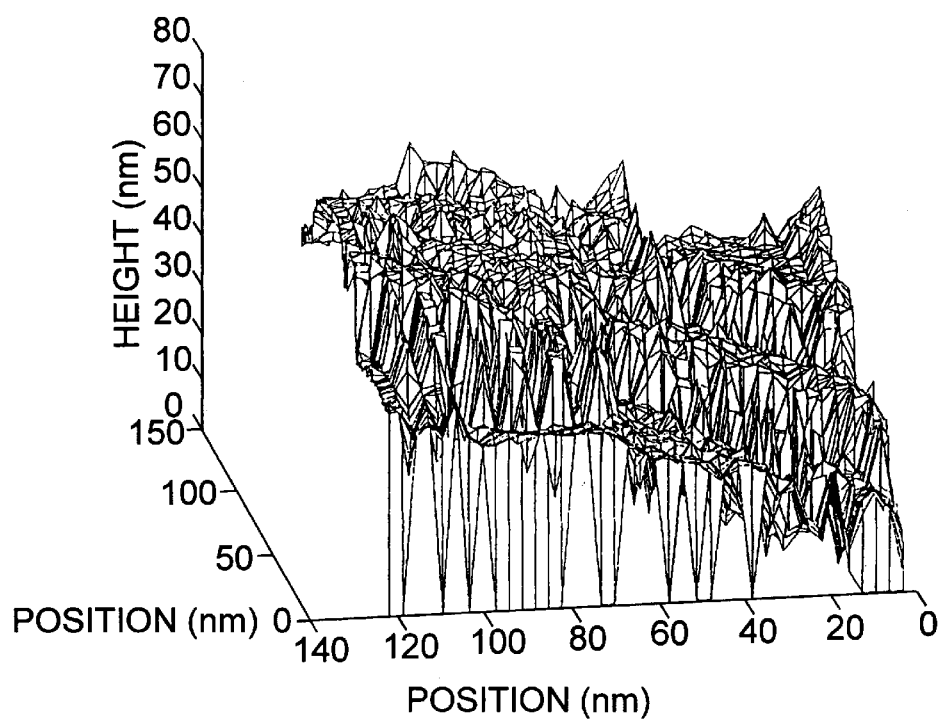

"Before" and "after" scans of the actual copper deposits made in this Example verify that copper deposition takes place. FIG. 8A shows an STM scan of the ITO surface before any copper deposition. FIG. 8B shows an STM scan of the ITO surface after copper deposition has occurred as described above. The constant current scans were obtained with a tunneling current of 2 nA, and a bias voltage of 500 mV. The ITO used in the experiment was removed from an electroluminescent strip, and it is believed that the removal of the ITO from the strip formed the ridges in the image illustrated in FIG. 8A. Referring to FIG. 8B, it is noted that the ridges have been filled in by the copper deposited. The units depicted of position and height are in nanometers, and are to scale in three dimensions.

Additional Applications of the Electrochemical Paintbrush

The electrochemical paintbrush circuit and technique has many applications in addition to the manufacture of masks for near-field photolithography. By reversing the direction of the current through the tip, the electrochemical paintbrush could remove material from a surface with a very high spatial resolution. The circuit could be used to modify preexisting photolithography masks, either by fixing broken traces or by removing unwanted material. This also gives circuit designers a lower cost option to prototyping integrated circuit designs because a particular pattern can be revised and the same mask can thus evolve over time.

The electrochemical paintbrush's ability to lift small quantities of electorchemically active substances off a surface also provides a powerful a method of surface analysis. Once a "dab" of analyte has been lifted into the electrochemical solution by the paintbrush, standard chemical techniques could be used to identify or characterize the analyte. This process should provide chemical sensitivity with extremely high spatial resolution.

The electrochemical paintbrush may have uses in both inorganic and organic chemistry. The paintbrush can deposit electrochemically active reagents with high resolution. Such deposits could provide useful chemical sensors, as well as have applications in combinatorial chemistry.

Importantly, the electrochemical paintbrush is not confined to use in the nanoscale range. Higher power versions of the circuit and larger dimensional amounts of material could be used in industrial applications, such a plating a large pattern of one metal onto another. Further, when run in reverse polarity at high power, the electrochemical paintbrush could be used to mill parts from a solid block of metal. In non-nanoscale applications, the STM 100 and its electrochemical tip 130 can be replaced with a more conventional platinum electrode, having thereon an insulated coating (e.g., parrafin) and an exposed tip that provides the desired spatial resolution in an electrolytic solution, for the size of the dab to be deposited or removed.

High spatial resolution deposits on transparent ITO may have useful optical properties. Sub-wavelength deposits could be used to create diffraction gratings and optical filters. For certain optical uses, the material deposited on ITO need not be an opaque metal, but could be any electrochemically active material with desirable optical properties.

Near-Field Photolithography

A near-field scanning optical microscope (NSOM) is a scanning probe microscope where an extremely fine fiber-optic strand is scanned over the surface of a sample. Because the fiber-optic strand in an NSOM is within 10 nm of the sample, diffraction does not limit the imaging resolution. NSOMs have been used to create images of a size down to a single molecule (See, for example, M. Nieto-Vesperinas and Nicolas Garcia (eds.), *Optics at the Nanometer Scale: Imaging and Storing with Photonic Near Fields*, (Kluwer Academic, Boston, 1996) ("Nieto-Vesperinas-Garcia"); Courjon et. al., "Instrumentation in near field optics" in Nieto-Vesperinas-Garcia, pp. 105–117; Betzig et al., "Single molecules observed by near-field scanning optical microscopy" *Science*, V. 262 (Nov. 26, 1993) pp. 1422–5; Collins, "Near-field optical microscopes take a close look at individual molecules" *Physics Today*, V. 47 (May 1994) pp. 17–20; Hwang et al., "Nanoscale complexity of phospholipid monolayers investigated by near-field scanning optical microscopy" *Science*, V. 270 (Oct. 27, 1995) pp. 610–14; and Zenhausen et al., "Scanning interferometric apertureless microscopy: optical imaging at 10 angstrom resolution" *Science*, V. 269 (Aug. 25, 1995) pp. 1083–5.

Several authors have used an STM to create electrochemically nanoscale features on surfaces. See, e.g., Gewirth et al, *Nanoscale Probes of the Solid/Liquid Interface*, (Kluwer Academic, Boston, 1995) and the articles therein by Lagraff et al., "AFM studies of copper solid-liquid interfaces," pp. 83–101; Nichols, "Scanning probe microscopy studies of copper electrodeposition," pp. 163–182, Wenjie Li et. al., "Electrochemical deposition of metal nano-disk structures using the scanning tunneling microscope," pp. 183–192; and Fan et al., "Single Molecule Electrochemistry", *Journal of the American Chemical Society*, V. 118, (Oct. 9, 1996) pp. 9669–9675). Others have used an NSOM to pattern photosensitive surfaces with a resolution of down to 60 nm. See, e.g., Ambrose et al., "Alterations of single molecule fluorescence lifetimes in near-field optical microscopy" *Science*, V. 265 (Jul. 15, 1994) pp. 364–7; Madsen et al., "Surface modifications via photo-chemistry in a reflection scanning near-field optical microscope" in Nieto-Vesperinas-Garcia, pp. 263–275; and J. Massamell et. al. "Writing of nanolines on a ferroelectric surface with a scanning near field optical microscope" in Nieto-Vesperinas-Garcia, pp. 181–190. While STM and NSOM patterning methods have high resolution, they both have the disadvantage of being serial in nature. That is, the STM or NSOM tip acts like a pencil, only able to create one feature at a time. This is much too slow for practical applications in nanoscale manufacturing, especially semiconductor microchip production, as recognized in "The limits of lithography" *Scientific American*, (September 1995), p. 66; and Stix, "Toward 'point one'" *Scientific American* (February 1995), pp. 90–5.

Figure 9A:
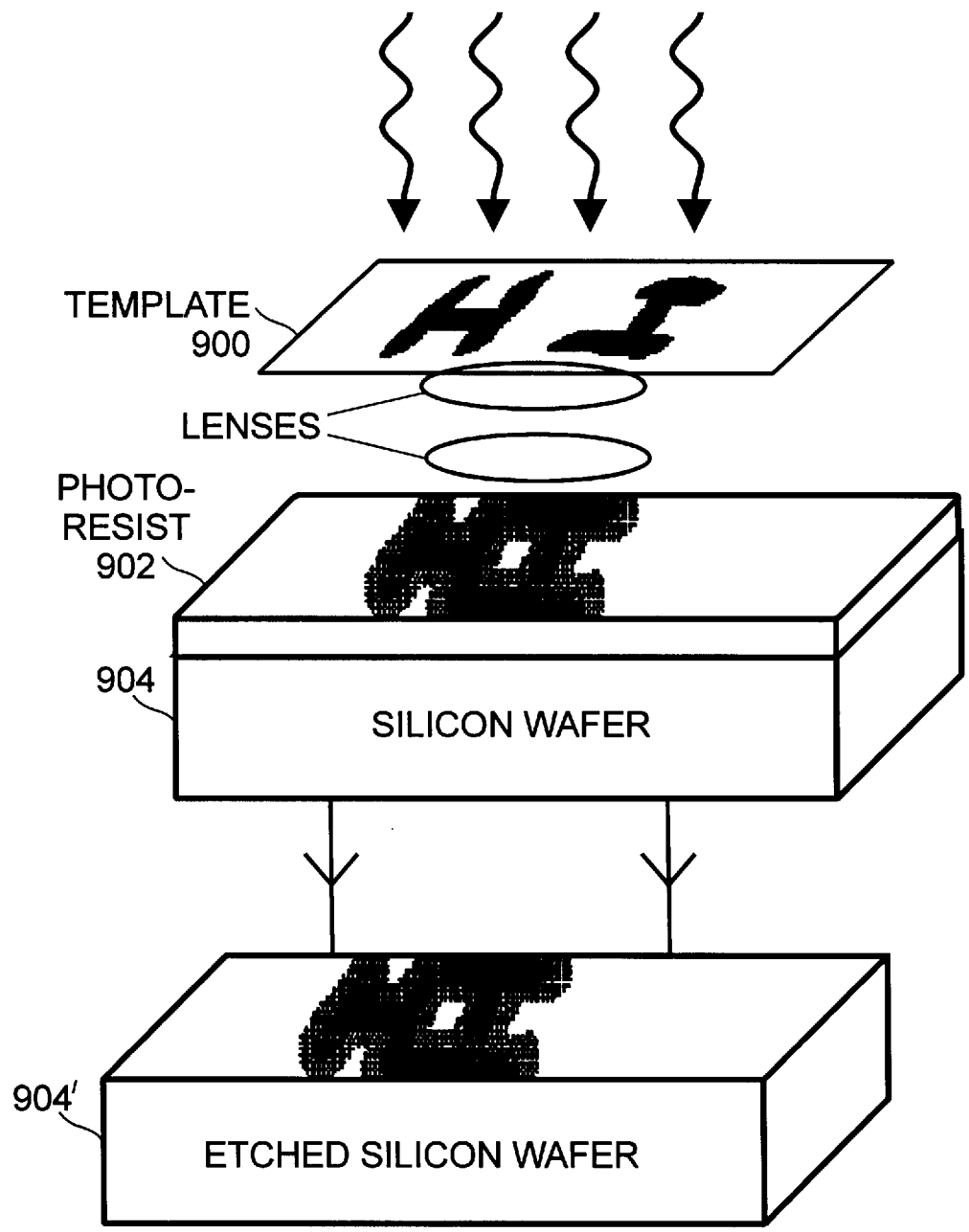
FIGS. 9A and 9B are respectively illustrations of prior art photolithography and near-field photolithography.
Figure 9B:
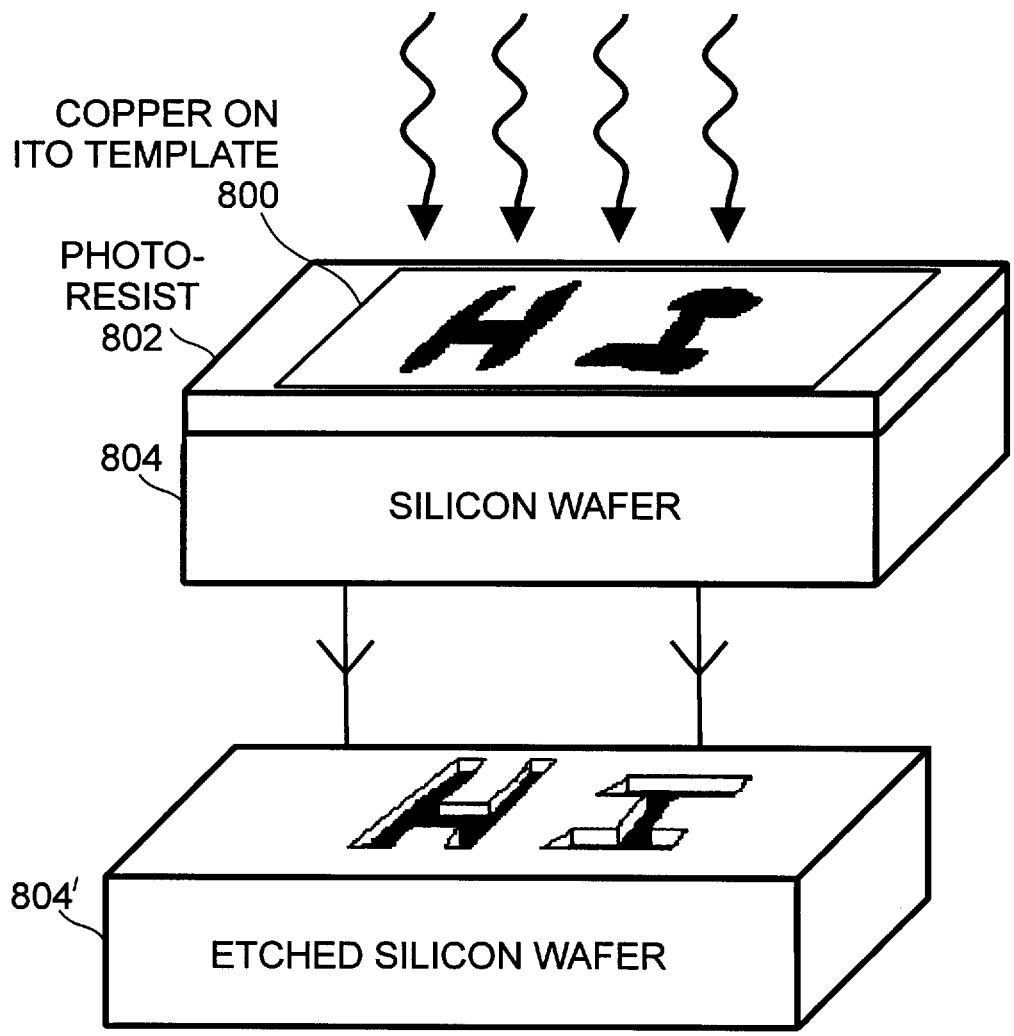

Advantageously, it has been recognized by the inventor that there exists a new field of lithographic technology, that of near-field photolithography, which can be implemented in a commercially acceptable and useful manner. Near-field photolithography as contemplated by the inventor combines certain aspects of the STM and NSOM structures and techniques in an advantageous manner that is capable of higher-speed nanoscale patterning. In accordance with the present invention, for near-field photolithography, an STM deposits a pattern of copper or other suitable opaque materal that is electroplateable, e.g., gold, silver, tin, zinc, nickel, chromium etc., on a transparent ITO electrode. The ITO patterned with copper is then used as a photolithographic mask. With reference to FIG. 9B, the mask 800 is directly placed against a photosensitive substrate, e.g., a semiconductor chip 804 or wafer, coated with a light sensitive resist 802 and exposed to a light source. Preferably, the opaque pattern is placed in touching contact with the resist coating. The light shining through the mask creates a copy of the mask's pattern on the photosensitive material which can then be etched away (see semiconductor 804'). Each mask could be used multiple times, to create many copies of a pattern, just as in the case of a conventional mask having a dimensional resolution of 0.2 micrometers or greater. However, because the mask of the present invention is in close proximity or direct contact with the resist coating on the substrate, the light shining through the mask is still in the near-field when it hits the resist coating on the substrate. Near-field resolution is not Abbe-diffraction limited; therefore, it is possible to create features that are much smaller than the wavelength of light used in the photo lithographic process. Consequently, by creating a photolithographic mask using the STM 100 of the present invention, which has a nanoscale resolution, near-field photolithography can be used to obtain the same high resolution (small dimensions) of NSOM patterning, and yet retain the speed and volume of production of conventional photolithography, by moving the photolithographic mask of the present invention into the near-field. Near-field photolithography thus offers a solution to the resolution problems existing in conventional photolithography. Compare to FIG. 9A, where the mask 900 is spaced from the photoresist 902, and lenses 901 are interposed therebetween to focus an image on photoresist 902, which is then processed to etch semiconductor 904.

Advantageously, too, near-field photolithography would not be so slow as the current efforts using microscopes to make nanoscale structures, because a copper-on-ITO template, once created, could be used many times. Moreover, a copper-on-ITO template can be used to create an even larger template by a step and expose, near-field, photolithographic process, so as to create a "super" mask or reticle having a dimension suitable to expose an entire semiconductor wafer in a single exposure.

Near-field photolithography, although in its infancy, is believed to be a viable and valuable technology. Surfaces to be patterned by near-field photolithography should first be treated to be extremely flat, so that diffraction that might otherwise arise from excessive spacing between the mask pattern and the semiconductor substrate will not come into play. The spacing is preferably maintained at less than 100 nanometers (more preferably less than 50 nanometers, with touching contact preferred. Further, the stability of the deposits of copper on ITO should be maintained and, as noted other electrochemically transferable materials, such as silver, gold, tin, zinc, nickel, chromium, aluminum, molybdenum, cadium and the like, may be well-suited for use in place of copper, and other transparent conductive layers 12 may be well-suited for use in place of ITO. Further, alloys may be used, as may surface treatments of the conductive material, e.g., hydrogen passivation, or nitriding. Suitable photosensitive materials ("resists") used on the substrate to be exposed are those which will undergo a useful change when exposed to low levels of light, which may require some empirical study before a widespread commercially acceptable standard is developed. Once these parameters have been selected, which are believed to be within the abilities of a person of ordinary skill in the relevant arts, the optical, electronic, and mechanical properties of materials patterned with near-field photolithography are expected to provide new structures which have a wide variety of applications in the semiconductor and integrated circuit manufacturing industry, as well as open up new areas of further research.

It is particularly envisioned that nanoscale semiconductor circuits can be formed with circuit elements as small as 10 to 100 nanometers, by using near field photolithographic masks and near field photolithography to form the pattern in a semiconductor, such that the semiconductor is otherwise processed in the known manner to dope, oxidize, and etch the semiconductor to form integrated circuits in the otherwise conventional and well known manners. This can lead to a reduced size of integrated circuits, and all of the benefits attendant thereto, e.g., savings in manufacturing costs, materials and labor, and increased effective yields.

It also is believed within the scope of the invention to generate an x-ray opaque mask on an x-ray transmissive substrate by appropriate selection of a substrate, e.g., quartz, and depositing thereon electrochemically a pattern by an appropriate material being selected in place of copper. As a result, near field x-ray lithography also may be achieved to produce semiconductor circuits.

It also is believed to be within the scope of the invention to perform near field photolithography based on using nanoscale masks formed by non-electrochemical techniques, e.g., electron beam or x-ray processes.

One skilled in the art will appreciate that the present invention can be practiced by other than the described embodiments and in application other than those described herein, which are presented for purposes of illustration and not of limitation.

I claim:

1. A method for patterning an electrically conductive material comprising:

a) providing an inert electrode covered by an insulator and having an exposed end;

b) mounting said inert electrode on an actuator movable in three dimensions, including an x-y plane and a z axis;

c) providing a consumable electrode comprising an electroplatable material;

d) immersing the electrically conductive material and at least a portion of each of said inert electrode and said consumable electrode in a solution containing ions of said electroplatable metal;

e) passing a first current between said consumable electrode and said exposed end of the inert electrode and depositing on said exposed end a first amount of electroplatable material;

f) positioning said inert electrode exposed end a distance from an area of said electrically conductive material; and g) passing a second current between said inert electrode exposed end and said area of the electrically conductive substrate and depositing on said area the first amount of electroplatable material, wherein step f) occurs before or after step e).

2. The method of claim 1 further comprising repositioning said inert electrode relative to said electrically conductive material and repeating steps e), f) and g) to deposit a plurality of first amounts to create a pattern on a different area of said electrically conductive material.

3. The method of claim 2 wherein each step g) further comprises depositing a first amount of material having a nanoscale resolution.

4. A method of removing an electrochemically active material that is a part of or in contact with an electrically conductive material, comprising:

a) providing an electrode having an insulated coating and an exposed tip;

b) mounting said electrode on an actuactor movable in three dimensions, including an x-y plane and a z-axis;

c) immersing the electrochemically active material and at least a portion of each of said electrode exposed tip in an aqueous electrochemical solution containing an ionic form of an electroplatable material;

d) positioning the electrically conductive material in an x-y plane relative to the electrode exposed tip so that a first area of said electrochemically active material is aligned with and spaced from said tip;

e) passing a first current between said electrode exposed tip and said electrically conductive material and causing at least a portion of said first area of said electrochemically active material to go into solution;

f) providing a second electrode; and g) passing a second current between said electrode exposed tip and said second electrode and depositing an amount of said electrochemically active material on said second electrode.

5. The method of claim 4 further comprising
repositioning said electrode exposed tip relative to said electrically conductive material in said x-y plane so that a different area of said electrically conductive material is aligned with and spaced from said exposed tip and passing a second current between said exposed tip and depositing said portion of the electrochemically active material on said different area.

6. The method of claim 5 further comprising performing steps d and e to modify a pattern of a photolithographic mask.

7. The method of claim 6 wherein step e) further comprises passing a first current for a time to remove an amount of electroplatable material having a nanoscale dimension.

8. The method of claim 4 wherein the electrochemically active material is an electroplatable material, the electrically conductive material is indium oxide, and the electroplatable material is deposited on said indium oxide in a pattern forming a photolithographic mask.

* * * * *